US010768247B2

United States Patent
Jia et al.

(10) Patent No.: US 10,768,247 B2
(45) Date of Patent: Sep. 8, 2020

(54) SYSTEM, APPARATUS AND METHOD FOR ACHIEVING SCANNING SAFETY FOR A MAGNETIC RESONANCE CONDITIONALLY SAFE IMPLANT

(71) Applicant: Siemens Healthcare GmbH, Erlangen (DE)

(72) Inventors: Jianzhang Jia, Shenzhen (CN); Jun Wang, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 105 days.

(21) Appl. No.: 16/118,674

(22) Filed: Aug. 31, 2018

(65) Prior Publication Data

US 2019/0072621 A1  Mar. 7, 2019

(30) Foreign Application Priority Data

Sep. 1, 2017 (CN) .......................... 2017 1 0778714

(51) Int. Cl.
| | |
|---|---|
| *G01R 33/28* | (2006.01) |
| *H03F 1/52* | (2006.01) |
| *H03F 3/19* | (2006.01) |
| *H03F 3/21* | (2006.01) |
| *G01R 33/36* | (2006.01) |
| *G01R 33/385* | (2006.01) |
| *G01R 33/54* | (2006.01) |

(52) U.S. Cl.
CPC ......... *G01R 33/288* (2013.01); *G01R 33/543* (2013.01); *H03F 1/52* (2013.01); *H03F 3/19* (2013.01); *H03F 3/21* (2013.01); *G01R 33/285* (2013.01); *G01R 33/3614* (2013.01); *G01R 33/3852* (2013.01); *H03F 2200/321* (2013.01); *H03F 2200/426* (2013.01); *H03F 2200/451* (2013.01)

(58) Field of Classification Search
CPC combination set(s) only.
See application file for complete search history.

(56) References Cited

U.S. PATENT DOCUMENTS

| | | | |
|---|---|---|---|
| 2005/0260955 A1* | 11/2005 | Bielmeier | G01R 33/3614 455/115.1 |
| 2009/0128153 A1* | 5/2009 | Graesslin | G01R 33/3607 324/322 |
| 2010/0312091 A1* | 12/2010 | Krueger | G01R 33/285 600/410 |
| 2015/0185298 A1* | 7/2015 | Crozier | A61B 5/055 702/19 |
| 2019/0056465 A1* | 2/2019 | Schnetter | G01R 33/288 |

\* cited by examiner

*Primary Examiner* — Jay Patidar
(74) *Attorney, Agent, or Firm* — Schiff Hardin LLP

(57) ABSTRACT

In a system, apparatus and method for achieving scanning safety for a magnetic resonance conditionally safe implant, an FPO processor converts an RF power signal received from an RF power sensor of an MR scanner into an RF power parameter, and converts a gradient power signal received from an MR gradient power sensor of the MR scanner into a gradient power parameter. Upon detecting that the RF power parameter exceeds an RF power limit value or/and the gradient power parameter exceeds a gradient power limit value, the FPO processor sends a shutdown signal, to shut down an RF power amplifier or/and a gradient power amplifier in the MR scanner. The MR scanner is thereby enabled to realize the FPO mode, without altering MR scanner software, and the workload is small and easy to carry out.

16 Claims, 5 Drawing Sheets

SYSTEM, APPARATUS AND METHOD FOR ACHIEVING SCANNING SAFETY FOR A MAGNETIC RESONANCE CONDITIONALLY SAFE IMPLANT

BACKGROUND OF THE INVENTION

Field of the Invention

The present invention relates to nuclear magnetic resonance technology, in particular to a system, apparatus and method for achieving scanning safety for a magnetic resonance conditionally safe implant.

Description of the Prior Art

Magnetic resonance imaging (MRI) is used for imaging diagnosis of all parts of a patient's body. When a patient undergoes an MRI scan, patient safety must be ensured. Thus, MRI safety parameter selection is indispensable. In particular, heating or tissue damage in a patient can occur due to the radio-frequency (RF) power that is radiated during the course of an MR scan, and peripheral nerve stimulation can occur due to the gradient fields that are activated during an MR scan.

Various types of medical implants may be present in a patient. ASTM International is an international standards-setting organization that develops and publishes voluntary consensus technical standards for a wide range of materials, products, systems and services. ASTM 2503-13 categorizes medical implants in three basic categories. A medical implant is categorized as MR Safe if it poses no known hazards resulting from exposure to any MR environment. An implant is categorized as MR Unsafe if the item poses unacceptable risks to the patient, medical staff or other persons within the MR environment. An implant is categorized as MR Conditional when it has demonstrated safety in the MR environment within defined conditions.

The Fixed Parameter Option (FPO) is an operating mode for MR scanners that has been developed to limit radio-frequency (RF) parameters and gradient output parameters during scanning of a magnetic resonance conditionally safe implant. Here, RF parameters include RF peak value and RF room mean square value (RMS); the RMS may also be a mean value. Gradient output parameters include gradient output peak value and gradient output RMS; the gradient output RMS may also be a mean value.

To achieve the abovementioned objective, manufacturers of magnetic resonance (MR) devices must ensure, when manufacturing an MR scanner, that the MR scanner is capable of realizing FPO, i.e. that the MR scanner is capable of controlling output parameters so as not to exceed FPO specified values, so that an FPO mode is realized on the MR scanner. When MRI is performed in the FPO mode of the MR scanner, if a control error occurs, such that output parameters exceed the FPO specified values, this will result in serious injury to the patient, or even the patient's death. Thus, it is necessary to install adapted software in the MR scanner to perform safety monitoring and protection. However, if the FPO mode is introduced in the MR scanner, then the software must be reset in the MR scanner, so the modification to the MR scanner is considerable, involving a large workload which is not easy to carry out.

SUMMARY OF THE INVENTION

In view of the above, an object of the present invention is to provide a system for achieving scanning safety for an MR conditionally safe implant, the system enabling an MR scanner to realize an FPO mode without altering MR scanner software.

The present invention also provides an apparatus for achieving scanning safety for an MR conditionally safe implant, the apparatus enabling an MR scanner to realize an FPO mode without altering MR scanner software.

The present invention also provides a method for achieving scanning safety for an MR conditionally safe implant, the method enabling an MR scanner to realize an FPO mode without altering MR scanner software.

A system according to the invention for achieving scanning safety for a magnetic resonance conditionally safe implant, has: a magnetic resonance (MR) scanner and a fixed parameter option (FPO) processor, the MR scanner having a radio-frequency (RF) power sensor, a gradient power sensor, an RF power amplifier (RFPA) unit and a gradient power amplifier (GPA). The FPO processor receives an RF power signal from the RF power sensor and converts the RF power signal to an RF power parameter, and receives a gradient power signal from the gradient power sensor and converts the gradient power signal to a gradient power parameter. Upon detecting that the RF power parameter exceeds an RF power limit value or/and that the gradient power parameter exceeds a gradient power limit value, the FPO processor sends a shutdown signal, to a controller of the MR scanner which then shuts down operation of the RFPA or/and the GPA.

The controller of the MR scanner is a computer or processor that controls the RF power sensor, the gradient power sensor, the RFPA and the GPA. In accordance with the invention; a switch is provided in a series connection path between the controller, and the RFPA and GPA. The shutdown of the RFPA and the GPA is controlled by the shutdown signal controlling the switch.

Preferably, the RF power sensor is arranged independently, or integrated in the RFPA; the gradient power sensor is arranged independently, or integrated in the GPA.

Preferably, the RF power parameter includes an RF power peak value and mean value obtained by subjecting the RF power signal to calculation, and the RF power limit value includes an RF power peak value limit value and mean value limit value.

Preferably, the gradient power parameter includes a gradient power peak value and mean value obtained by subjecting the gradient power signal to calculation, and the gradient power limit value includes a gradient power peak value limit value and a gradient power mean limit value.

An apparatus according to the invention for achieving scanning safety for an MR conditionally safe implant, has a digital control module, and a processing module for RF power signals and gradient power signals, wherein the digital control module controls the processing module for RF power signals and gradient power signals, and receives an RF power signal from an RF power sensor in an MR scanner and then converts the RF power signal to an RF power parameter, and receives a gradient power signal from a gradient power sensor in the MR scanner and then converts the gradient power signal to a gradient power parameter. The digital control module, upon detecting that the RF power parameter exceeds an RF power limit value or/and the gradient power parameter exceeds a gradient power limit value, sends a shutdown signal, that controls shutdown of an RFPA in the MR scanner or/and a GPA in the MR scanner.

Preferably, the RF power parameter is an RF power peak value and mean value obtained by subjecting the RF power signal to calculation, and the RF power limit value is an RF power peak value limit value and mean value limit value.

Preferably, the gradient power parameter is a gradient power peak value and mean value obtained by subjecting the gradient power signal to calculation, and the gradient power limit value is a gradient power peak value limit value and a gradient power mean limit value.

Preferably, the processing module for RF power signals and gradient power signals is composed of an RF power signal processing module and a gradient power signal processing module, wherein the RF power signal processing module is integrated in the RF power sensor in the MR scanner, and converts a detected RF power signal to an RF power parameter, and the gradient power signal processing module is integrated in the gradient power sensor in the MR scanner, and converts a detected gradient power signal to a gradient power parameter, and the RF power sensor sends the RF power parameter to the digital control module, and the gradient power sensor sends the gradient power parameter to the digital control module.

Preferably, the apparatus exchanges information with a host computer or control system.

Preferably, the apparatus further has a storage module, storing signals and data of the digital control module, or/and further has a user interface module, exchanging various types of information with the digital control module.

The apparatus may further have a power supply monitoring and watchdog module, which monitors a power supply state of the apparatus, and shuts down the RFPA and the GPA when it is determined that the power supply state of the apparatus does not comply with a requirement, and monitors a survival state of the digital control module, and performs resetting when the running of software therein fails.

The apparatus may further have a universal input/output interface, performing external communication of the apparatus.

A method according to the invention for achieving scanning safety for an MR conditionally safe implant, includes acquiring an RF power signal or/and a gradient power signal in an MR scanner, converting the RF power signal to an RF power parameter, and converting the gradient power signal to a gradient power parameter, upon detecting that the RF power parameter exceeds an RF power limit value or/and the gradient power parameter exceeds a gradient power limit value, sending a shutdown signal that controls shutdown of an RFPA or/and a GPA of the MR scanner.

Preferably, the RF power parameter includes an RF power peak value and mean value, obtained by calculation from the RF power signal after reshaping, amplification, filtering and analog-to-digital conversion; the RF power limit value comprises an RF power peak value limit value and mean value limit value.

Preferably, the gradient power parameter includes a gradient power peak value and mean value, obtained by calculation from the gradient power signal after reshaping, amplification, filtering and analog-to-digital conversion; the gradient power limit value comprises a gradient power peak value limit value and a gradient power mean limit value.

It can be seen from the solution above that in the present invention, an FPO processor is provided, which converts an RF power signal received from an RF power sensor of an MR scanner into an RF power parameter, and converts a gradient power signal received from an MR gradient power sensor of the MR scanner into a gradient power parameter, and upon detecting that the RF power parameter exceeds an RF power limit value or/and the gradient power parameter exceeds a gradient power limit value, sends a shutdown signal, to shut down an RF power amplifier or/and a gradient power amplifier in the MR scanner. In this way, the MR scanner is enabled to realize the FPO mode, without altering MR scanner software; the workload is small and easy to carry out.

DESCRIPTION OF THE PREFERRED EMBODIMENTS

In order to clarify the object, technical solution and advantages of the present invention, the present invention is explained in further detail below by embodiments.

Since software installed in an existing MR scanner is based on type B in the IEC standard, if the method of monitoring or supporting existing MR scanner hardware is used to realize an FPO mode, then there is no need to install type C software of the IEC standard in the existing MR scanner; it is possible to achieve a solution by retaining the software of type B in the IEC standard of the existing MR scanner. Thus, in the present invention, an FPO processor is independently provided; this unit converts an RF power signal received from an RF power sensor of an MR scanner into an RF power parameter, and converts a gradient power signal received from an MR gradient power sensor of the MR scanner into a gradient power parameter, and upon detecting that the RF power parameter exceeds an RF power limit value or/and the gradient power parameter exceeds a gradient power limit value, sends a shutdown signal, to shut down an RF power amplifier or/and a gradient power amplifier in the MR scanner.

In this way, the MR scanner is enabled to realize the FPO mode, without altering MR scanner software; the workload is small and easy to carry out. Since the FPO processor is independent, it can realize the FPO mode for the existing MR scanner flexibly and conveniently.

Figure 1:
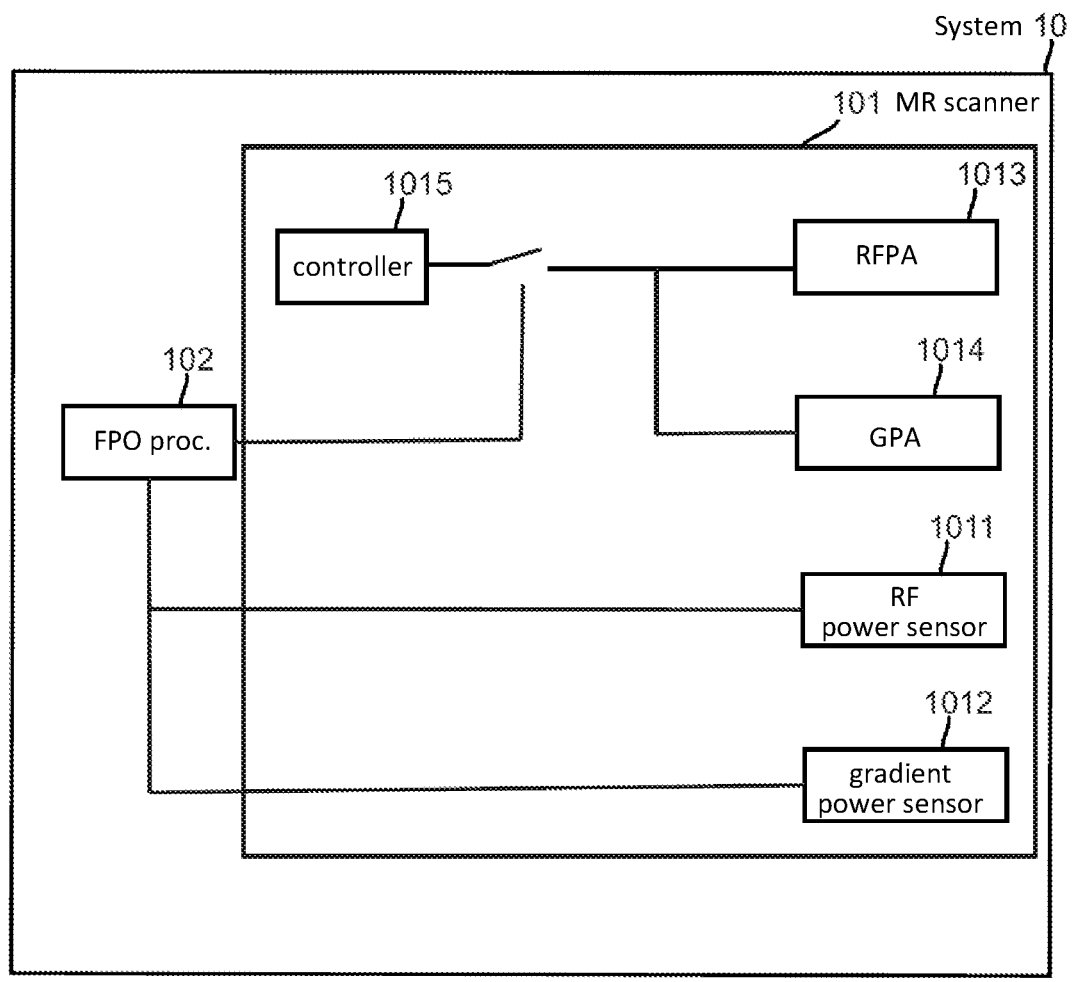
FIG. 1 is a block diagram of a system according to the present invention for achieving scanning safety for an MR conditionally safe implant.

FIG. 1 is a block diagram of a system provided in the present invention for achieving scanning safety for an MR conditionally safe implant. The system is labelled as system 10 in FIG. 1, and includes an MR scanner 101 and an FPO processor 102. The MR scanner 101 includes an RF power sensor 1011, a gradient power sensor 1012, an RF power amplifier (RFPA) 1013 and a gradient power amplifier (GPA) 1014.

The FPO processor 102 receives an RF power signal sent by the RF power sensor 1011 and converts that signal to an RF power parameter, and receives a gradient power signal sent by the gradient power sensor 1012 and converts that signal to a gradient power parameter. Upon detecting that the RF power parameter exceeds an RF power limit value or/and the gradient power parameter exceeds a gradient power limit value, the FPO processor sends a shutdown signal, to control the RFPA 1013 or/and the GPA 1014 to shut down.

In the system, the FPO processor 102 may communicate with the MR scanner 101, to exchange various types of information, and may also monitor an operating state of the MR scanner 101 by using a "heartbeat" signal. To ensure the reliability of communication between the FPO processor 102 and the MR scanner 101, communication may be realized using redundancy check (CRC) technology or another technology.

In the system, the FPO processor 102 may monitor the RF power signal and gradient power signal of the MR scanner 101 in real time, perform reshaping, amplification, filtering, analog-to-digital conversion and calculation separately to obtain the RF power parameter and gradient power parameter respectively, and shut down the GPA 1014 or/and the RFPA 1013 when the RF power parameter exceeds the RF power limit value or/and the gradient power parameter exceeds the gradient power limit value.

The MR scanner 101 in the system 10 further has a controller 1015, which controls the RF power sensor 1011, the gradient power sensor 1012, the RFPA 1013 and the GPA 1014. A switch is provided on a series connection path between the controller 1015, and the RFPA 1013 and the GPA 1014; the shutdown of the RFPA 1013 and the GPA 1014 is achieved by the shutdown signal by controlling the switch.

In the system, the RF power sensor 1011 may be a pickup coil in an RF coil, or an RF detector on an RF conduction path, etc.; the gradient power sensor 1012 is a gradient coil or a current sensor in the GPA 1014, etc.

In the system 10, to guarantee the reliability of the RF power sensor 1011 and the gradient power sensor 1012, it is possible to use a redundant sensor in each case, and to compare an acquired signal with a real-time sensor-acquired signal, to further ensure reliability.

In the system 10, the RF power sensor 1011 may be arranged independently, or integrated in the RFPA 1013; the gradient power sensor 1012 may be arranged independently, or integrated in the GPA 1014.

In the system 10, the FPO processor 102 may support an MR scanner 101 having a control protection (CP) function safety structure or an MR scanner 101 having a control processor protection (CPP) function safety structure. An MR scanner with a CP structure comprises one control path and one protection path; in this case, the FPO processor 102 may serve as one protection path and realize the protection path with automatic self-checking. An MR scanner 101 with a CPP structure comprises one control path and two protection paths; the FPO processor 102 may serve as one auxiliary protection path and need not realize the protection path with automatic self-checking protection, as checking is carried out by another protection path.

Figure 2:
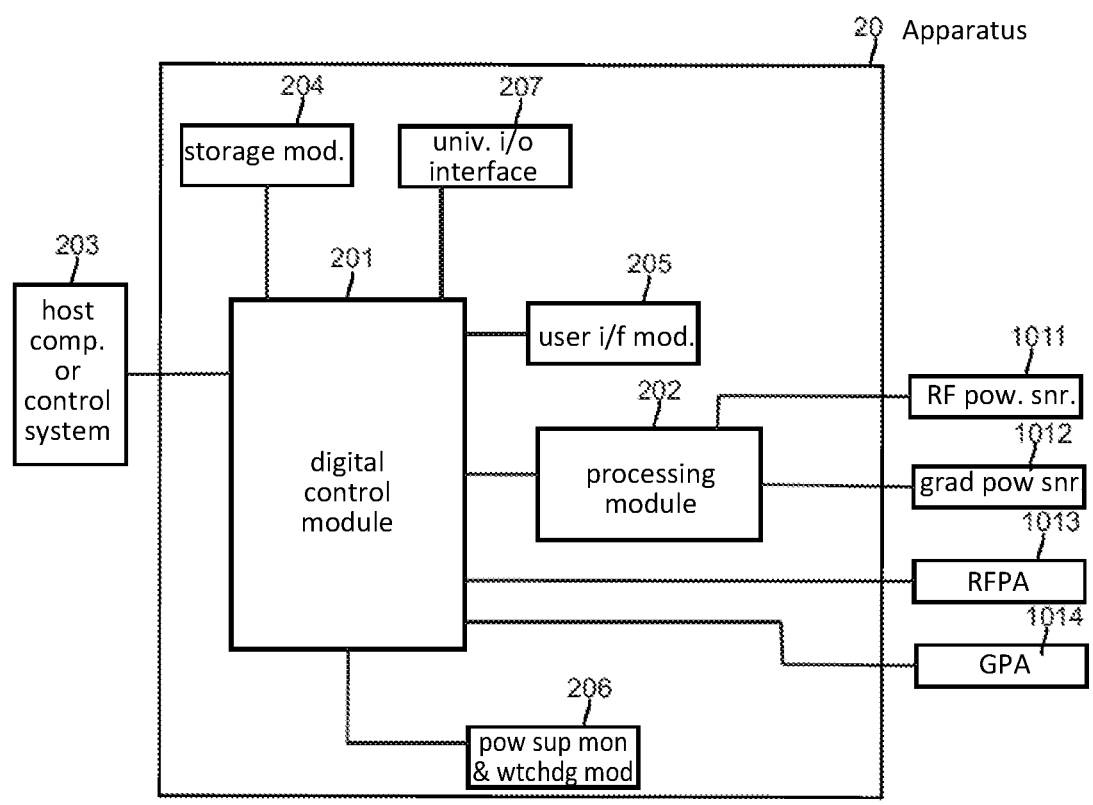
FIG. 2 is a block diagram of an apparatus according to the present invention for achieving scanning safety for an MR conditionally safe implant.

FIG. 2 is a block diagram of an apparatus according to the present invention for achieving scanning safety for an MR conditionally safe implant. The apparatus is labelled as apparatus 20 in FIG. 2, and has a digital control module 201, and a processing module 202 for RF power signals and gradient power signals.

The digital control module 201 controls the processing module 202 for RF power signals and gradient power signals, receives an RF power signal sent by an RF power sensor 1011 in an MR scanner, and then converts the RF power signal to an RF power parameter. The digital control module 201 also receives a gradient power signal sent by a gradient power sensor 1012 in the MR scanner, and then converts the gradient power signal to a gradient power parameter.

The digital control module 201 detects whether the RF power parameter exceeds an RF power limit value or/and the gradient power parameter exceeds a gradient power limit value and, when the digital control module 201 detects that the RF power parameter exceeds the RF power limit value or/and the gradient power parameter exceeds the gradient power limit value, a shutdown signal is sent, to control an RFPA 1013 in the MR scanner or/and a GPA 1014 in the MR scanner so as to shut down.

In the apparatus, the digital control module 201 is a component (circuitry) of an FPO processor, and may be realized in various ways, e.g. using a field programmable gate array (FPGA) with an integrated control core, using interaction between an FPGA and a complex programmable logic device (CPLD), using interaction between a digital signal processor (DSP) or a microcontroller (MCU) and an FPGA, or using interaction between a DSP or MCU and a coprocessor. The control core may employ a processor from Microsoft or ARM. A Linux operating system or Windows operating system is installed on the control core, DSP or MCU; software of various types may be set on the basis of these operating systems.

In the apparatus, the processing module 202 for RF power signals and gradient power signals is composed of an RF power signal processing module and a gradient power signal processing module. In this case, the RF power signal processing module is integrated in the RF power sensor 1011 in the MR scanner 101, converting a detected RF power signal to an RF power parameter; the gradient power signal processing module is integrated in the gradient power sensor 1012 in the MR scanner 101, converting a detected gradient power signal to a gradient power parameter; the RF power sensor 1011 sends the RF power parameter to the digital control module 201, and the gradient power sensor 1012 sends the gradient power parameter to the digital control module 201. Here, the sending is passed via digital communication.

In the apparatus, the processing module 202 for RF power signals and gradient power signals may be integrated in the MR scanner, and the RF power parameter and gradient power parameter, having been obtained by the MR scanner, are processed by the digital control module 201.

In the apparatus, the RF power parameter includes an RF power peak value and an RF power mean value, obtained by calculation from the RF power signal after reshaping, amplification, filtering and analog-to-digital conversion. The RF power limit value includes an RF power peak value limit value and an RF power mean limit value.

In the apparatus, the gradient power parameter includes a gradient power peak value and a gradient power mean value, obtained by calculation from the gradient power signal after reshaping, amplification, filtering and analog-to-digital conversion. The gradient power limit value includes a gradient power peak value and a gradient power mean limit value.

Figure 3:
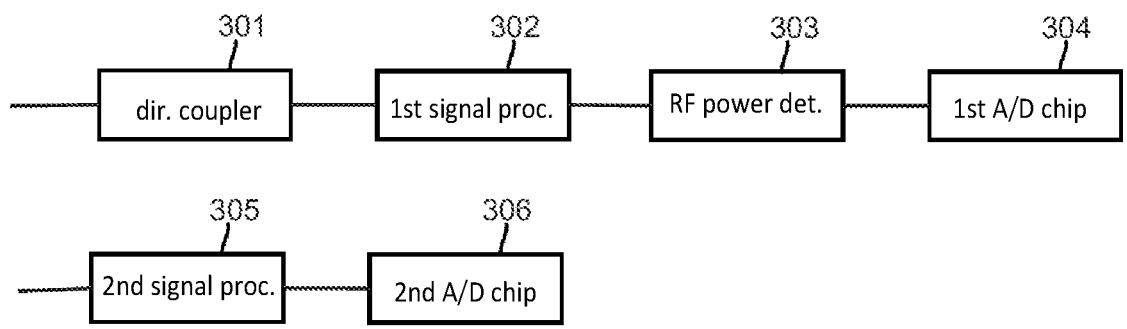
FIG. 3 is a block diagram of processing that takes place in a processing module, for RF power signals and gradient power signals according to the present invention.

FIG. 3 is a block diagram of a processing process of the processing module 202 for RF power signals and gradient power signals according to the present invention.

The processing module 202 for RF power signals and gradient power signals receives an RF power signal, which is a signal in the range of 0 to 90 degrees. Signal classification is performed by a directional coupler 301. After signal reshaping, amplification and filtering by a first signal processor 302, detection by an RF power detector 303 is performed. Finally, after analog-to-digital conversion by a first analog-to-digital chip 304, an RF power signal resulting from analog-to-digital conversion is obtained.

The processing module 202 for RF power signals and gradient power signals receives a gradient power signal. After signal reshaping, amplification and filtering by a second signal processor 305, analog-to-digital conversion by a second analog-to-digital chip 306 is performed, so as to obtain a gradient power signal resulting from the analog-to-digital conversion.

In the apparatus, the RF power signal resulting from analog-to-digital conversion and the gradient power signal resulting from analog-to-digital conversion are transmitted between the processing module 202 for RF power signals and gradient power signals and the digital control module 201 via a serial port, or by parallel communication. The serial port is a universal serial bus (USB), a high-speed serial computer expansion bus (PCI-E) or a controller area network bus (CAN); the parallel communication may be a hardwired communication, optoelectronic communication or wireless communication.

Figure 4:
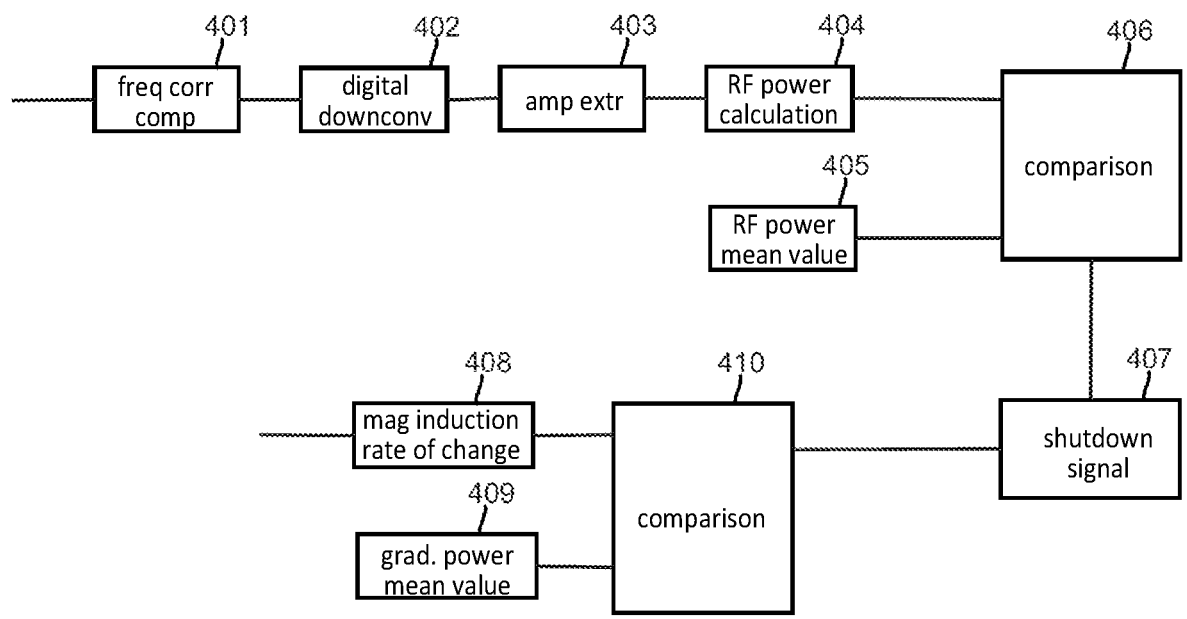
FIG. 4 is a block diagram of processing that takes place in a digital control module 201 according to the present invention.

FIG. 4 is a block diagram of a processing process of the digital control module 201 according to the present invention.

The digital control module 201 acquires the RF power signal resulting from analog-to-digital conversion from the processing module 202 for RF power signals and gradient power signals, performs frequency correction compensation 401, digital downconversion 402 and amplitude extraction 403, then performs RF power calculation 404 so as to obtain an RF power mean value 405 and an RF power peak value. The digital control module 201 then performs a comparison 406 of the obtained RF power peak value and mean value with an RF power limit value, and if this is exceeded, sends a shutdown signal 407 to shut down the RFPA 1013.

The digital control module 201 also acquires the gradient power signal resulting from analog-to-digital conversion from the processing module 202 for RF power signals and gradient power signals, and calculates a magnetic induction rate of change 408 so as to obtain a gradient power mean value 409 and a gradient power peak value. The digital control module 201 then performs a comparison 410 of the obtained gradient power mean value and gradient power peak value with a gradient power limit value, and if this is exceeded, sends a shutdown signal 407 to shut down the GPA 1014.

The apparatus may also exchange information, such as patient diagnostic information, with a host computer or control system 203, and monitor a survival state of the host computer or control system 203 by means of a heartbeat signal. The apparatus may conduct serial communication or parallel communication with the host computer or control system 203; the serial communication may be conducted by USB, PCI-E or CAN, and the parallel communication may be wired communication, optoelectronic communication or wireless communication.

The apparatus further has a storage module 204, as a storage medium of the digital control module 201, to store signals and data, etc.; the storage module may be flash memory, static random access memory (SRAM), dynamic random access memory (DRAM), solid state disk or hard disk drive (HDD), etc.

The apparatus further has a user interface module 205, by means of which a user exchanges various types of information with the digital control module 201.

The apparatus further has a power supply monitoring and watchdog module 206, that monitors a power supply state of the apparatus, and shut down the RFPA 1013 and the GPA 1014 when it is determined that the power supply state of the apparatus does not comply with requirements. The power supply monitoring and watchdog module 206 monitors a survival state of the digital control module 201, and performs resetting when the running of software therein fails.

The apparatus further has a universal input/output interface 207, to perform external communication of the apparatus; this may be digital or analog, and may be hardwired or wireless.

Figure 5:
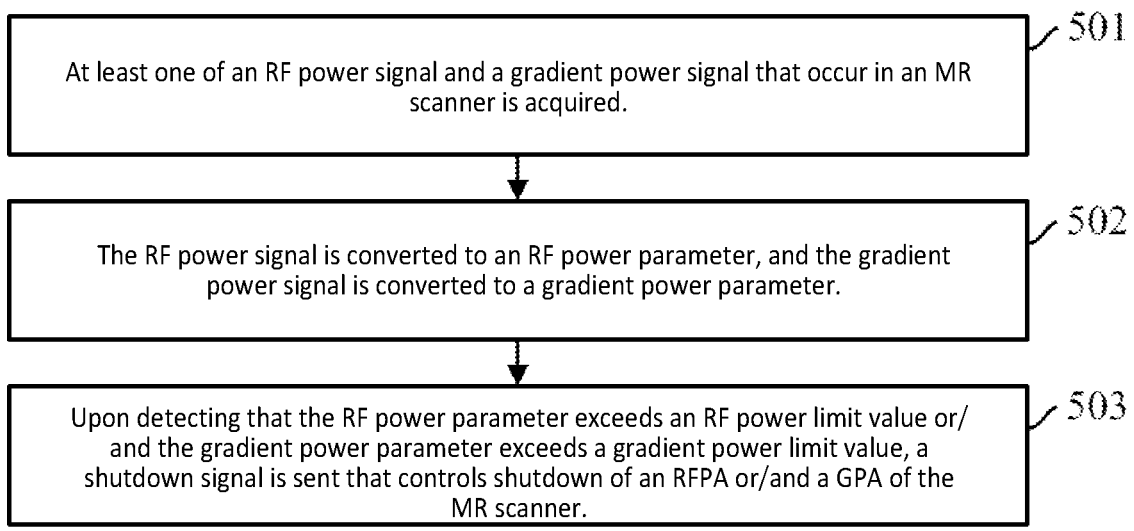
FIG. 5 is a flowchart of the method according to the present invention for achieving scanning safety for an MR conditionally safe implant.

FIG. 5 is a flowchart of a method provided in the present invention for achieving scanning safety for an MR conditionally safe implant, having the following specific steps.

In step 501, at least one of an RF power signal and a gradient power signal that occur in an MR scanner is acquired.

In step 502, the RF power signal is converted to an RF power parameter, and the gradient power signal is converted to a gradient power parameter.

In step 503, upon detecting that the RF power parameter exceeds an RF power limit value or/and the gradient power parameter exceeds a gradient power limit value, a shutdown signal is sent that controls shutdown of an RFPA or/and a GPA of the MR scanner.

In the method, the RF power parameter can include an RF power peak value and mean value, obtained by calculation from the RF power signal after reshaping, amplification, filtering and analog-to-digital conversion; the RF power limit value the includes an RF power peak value limit value and mean value limit value. The RF power limit is set on the basis of an IEC standard.

In the method, the gradient power parameter can include a gradient power peak value and mean value, obtained by calculation from the gradient power signal after reshaping, amplification, filtering and analog-to-digital conversion; the gradient power limit value then includes a gradient power peak value limit value and a gradient power mean limit value. The RF power limit is set on the basis of an IEC standard.

When the solution of the present invention realizes the FPO mode in the MR scanner, alterations to hardware and software of the MR scanner are small, and constraints on alterations are also small; since the FPO processor is independently arranged, it can easily become an optional component of the MR scanner, and supports MR scanners of various structural types, saving costs and being easy to implement. The FPO processor according to the present invention may be expanded, and supports online monitoring of RF power and gradient power of the MR scanner. The FPO processor according to the present invention integrates monitoring of the RF power and gradient power of the MR scanner, and incorporates power supply monitoring and watchdog monitoring, to ensure the normal operation of the FPO processor.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A system for achieving scanning safety for a magnetic resonance (MR) conditionally safe implant, said system comprising:

an MR scanner comprising a radio-frequency (RF) power amplifier and an RF sensor that generates an RF power signal representing RF power emitted by said RF power amplifier, and a gradient power amplifier and a gradient power sensor that emits a gradient power sensor signal representing gradient power emitted by said gradient amplifier;

a fixed parameter option (FPO) processor configured to operate the MR scanner in an FPO mode in order to comply with requirements for safely scanning a subject having a conditionally safe implant therein;

said FPO processor comprising an interface that receives said RF power signal and said gradient power signal, said FPO processor being configured to convert said RF power signal into an RF power parameter and to convert said gradient power signal into a gradient power parameter;

said FPO processor being configured to determine when at least one of said RF power parameter exceeds an RF power limit value or said gradient power parameter exceeds a gradient power limit value;

said FPO processor being configured, when said RF power parameter exceeds said RF power limit value, to emit a shutdown signal that causes operation of said RF power amplifier to be discontinued; and said FPO processor being configured, when said gradient power parameter exceeds said gradient power limit value, to emit a shutdown signal that causes operation of said gradient power amplifier to be discontinued.

2. A system as claimed in claim 1 comprising a controller configured to control operation of said RF power sensor, said gradient power sensor, said RF power amplifier and gradient power amplifier, said controller comprising a switch in a series connection path between said controller and said radio-frequency power amplifier, said gradient power amplifier, and wherein said controller is configured to receive said shutdown signal from said FPO processor in order to control said switch to discontinue said operation of at least one of said radio-frequency power amplifier and said gradient power amplifier.

3. A system as claimed in claim 1 wherein said RF power sensor is structurally independent of said radio-frequency power amplifier.

4. A system as claimed in claim 1 wherein said RF power sensor is integrated in said radio-frequency power amplifier.

5. A system as claimed in claim 1 wherein said gradient power sensor is structurally independent of said gradient power amplifier.

6. A system as claimed in claim 1 wherein said gradient power sensor is integrated in said gradient power amplifier.

7. A system as claimed in claim 1 wherein:

said FPO processor is configured to convert said RF power signal into said RF power parameter so that said RF power parameter comprises an RF power peak value and a mean value calculated from said RF power signal, and wherein said RF power limit value comprises an RF power peak value limit value and a mean value limit value; and said FPO processor is configured to convert said gradient power signal into said gradient power parameter so that said gradient power parameter comprises a gradient power peak value and a mean value calculated from said gradient power signal, and wherein gradient power limit value comprises a gradient power peak value limit value and gradient power mean limit value.

8. An apparatus for achieving scanning safety for a magnetic resonance (MR) conditionally safe implant, said apparatus comprising:

a power signal processing processor configured to convert an RF power signal, received from an RF power sensor in an MR scanner into an RF power parameter, and to convert a gradient power signal, received from a gradient power sensor in said MR scanner, into a gradient power parameter;

a digital control processor in communication with said power signal processing processor, said digital control processor being configured to receive the RF power parameter and gradient power parameter from said power signal processing processor and to detect whether said RF power parameter exceeds an RF power limit value and whether said gradient power parameter exceeds a gradient power limit value;

said digital control processor being configured, when said RF power parameter exceeds said RF power limit value, to emit an shutdown signal that discontinues operation of an RF power amplifier that produces RF power represented by said RF power signal; and said digital control processor being configured, when said gradient power parameter exceeds said gradient power limit value, to emit a shutdown signal that discontinues operation of a gradient power amplifier that produces gradient fields having a gradient power represented by said gradient power signal.

9. An apparatus as claimed in claim 8 wherein:

said power signal processing processor is configured to convert said RF power signal into said RF power parameter so that said RF power parameter comprises an RF power peak value and a mean value calculated from said RF power signal, and wherein said RF power limit value comprises an RF power peak value limit value and a mean value limit value; and said power signal processing processor is configured to convert said gradient power signal into said gradient power parameter so that said gradient power parameter comprises a gradient power peak value and a mean value calculated from said gradient power signal, and wherein gradient power limit value comprises a gradient power peak value limit value and gradient power mean limit value.

10. An apparatus as claimed in claim 8 wherein:

said power signal processing processor comprises an RF power signal processor and a gradient power signal processor;

said RF power signal processor being integrated in said RF power sensor in said MR scanner and being configured to convert said RF power signal into said RF power parameter; and said gradient power signal processor being integrated in said gradient power sensor in said MR scanner, and being configured to convert said gradient power signal to said gradient power parameter.

11. An apparatus as claimed in claim 8 comprising a memory in communication with said power signal processing processor and said digital control processor, in which said digital control processor and said power signal processing processor are configured to store said RF power signal, said gradient power signal, said RF power parameter, and said gradient power parameter.

12. An apparatus as claimed in claim 8 wherein said digital control processor comprises a user interface configured to receive and present information relevant to operation of said digital control processor.

13. An apparatus as claimed in claim 8 comprising a power supply monitoring and watchdog processor configured to monitor a power supply state of at least one of said digital control processor and said power signal processing processor, and to discontinue operation of said radio-frequency power amplifier and said gradient power amplifier when said power supply state does not comply with a predetermined requirement, and to monitor a survival state of said digital control processor and, when necessary, to reset said digital control processor, if software operating said digital control processor fails.

14. An apparatus as claimed in claim 8 comprising a universal input/output interface allowing external communication to and from at least said digital control processor.

15. A method for achieving scanning safety for a magnetic resonance (MR) conditionally safe implant, during an MR scan conducted by an MR scanner comprising a radio-frequency (RF) power amplifier and an RF sensor that generates an RF power signal representing RF power emitted by said RF power amplifier, and a gradient power amplifier and a gradient power sensor that emits a gradient power sensor signal representing gradient power emitted by said gradient amplifier, said method comprising:

with a fixed parameter option (FPO) processor, operating the MR scanner in an FPO mode in said scan in order to comply with requirements for safely scanning a subject having a conditionally safe implant therein;

providing said RF power signal and said gradient power signal to said FPO processor and, in said FPO processor, converting said RF power signal into an RF power parameter and converting said gradient power signal into a gradient power parameter;

in said FPO processor, determining when at least one of said RF power parameter exceeds an RF power limit value or said gradient power parameter exceeds a gradient power limit value;

when said FPO processor determines that said RF power parameter exceeds said RF power limit value, emitting a shutdown signal from the FBO processor that causes operation of RF power amplifier to be discontinued; and when said FPO processor determines that said gradient power parameter exceeds said gradient power limit value, emitting a shutdown signal from said FPO processor that causes operation of said gradient power amplifier to be discontinued.

16. A method as claimed in claim 15 comprising:

in said FPO processor, converting said RF power signal into said RF power parameter so that said RF power parameter comprises an RF power peak value and a mean value calculated from said RF power signal, and wherein said RF power limit value comprises an RF power peak value limit value and a mean value limit value; and in said FPO processor, converting said gradient power signal into said gradient power parameter so that said gradient power parameter comprises a gradient power peak value and a mean value calculated said gradient power signal, and wherein gradient power limit value comprises a gradient power peak value limit value and gradient power mean limit value.

* * * * *